United States Patent [19]
Ohta

[11] Patent Number: 5,936,982
[45] Date of Patent: Aug. 10, 1999

[54] VARIABLE WAVELENGTH LASER LIGHT SOURCE

[75] Inventor: Katsushi Ohta, Tokyo, Japan

[73] Assignee: Ando Electric Co., Ltd., Tokyo, Japan

[21] Appl. No.: 09/014,508

[22] Filed: Jan. 28, 1998

[30]  Foreign Application Priority Data

Jan. 31, 1997  [JP]  Japan ..................................... 9-032673

[51] Int. Cl.⁶ ....................................................... H01S 3/16
[52] U.S. Cl. .................................. 372/20; 372/98; 372/6; 372/69
[58] Field of Search ................................. 372/20, 98, 45, 372/62, 6, 108, 71, 75

[56]  References Cited

U.S. PATENT DOCUMENTS

| | | | |
|---|---|---|---|
| 4,299,710 | 11/1981 | Shoshan | 372/92 |
| 5,334,854 | 8/1994 | Ono et al. | 372/45 |
| 5,572,542 | 11/1996 | Dixon | 372/92 |

*Primary Examiner*—Leon Scott, Jr.
*Attorney, Agent, or Firm*—Flynn, Thiel, Boutell & Tanis, P.C.

[57]  ABSTRACT

A highly stable variable wavelength laser light source of simple construction and having excellent productivity is provided. With the variable wavelength laser light source wherein a laser diode is provided with a non-reflection film on the front end face, and a high reflection film on the rear end face, outgoing light from the laser diode is condensed by a lens, branched out by a recombination and branching filter after falling thereon, and sent out to a wavelength selector selecting a light beam of a specific wavelength, which is returned to the laser diode via a recombination and branching filters and the recombination and branching filter and after condensed by the lens so that a laser beam is produced through resonance by the external resonator composed of an optical return path section and the high reflection film, and the laser beam is delivered from an output port via a recombination and branching filter.

2 Claims, 2 Drawing Sheets

VARIABLE WAVELENGTH LASER LIGHT SOURCE

BACKGROUND OF THE INVENTION

1. Field of the Invention

The invention relates to a variable wavelength laser light source, and particularly, to a variable wavelength laser light source capable of causing laser oscillation by use of an external resonator composed of a high reflection film face provided on the back end of a laser diode, and an optical return path for enabling outgoing light from the laser diode to return thereto.

2. Prior Art

It is well known that laser oscillation is caused to occur by means of an external resonator formed between one end face of a Fabry-Perot laser diode, provided with a non-reflection film, and the other end face thereof by causing a light beam to return to the laser diode by use of a device having wavelength selectivity provided that gain condition and phase condition overcome losses such as reflection loss, scattering loss, and the like.

Thus, a variable wavelength laser light source is set up by causing a laser beam of optional wavelength selected from outgoing light sent out from a laser diode capable of causing laser oscillation to return to the laser diode.

FIGS. 3 and 4 are schematic illustration showing examples of conventional variable wavelength laser light sources, respectively. Firstly, referring to FIG. 3, a laser diode 8a is provided with a low reflection film 8b on one end face, and a non-reflection film 8c on the other end face. Laser light outgoing from the laser diode 8a is converted to a collimated light beam by a lens 9b, and in front of the lens 9b, a total reflection mirror 13 is disposed via a light-variable band-pass filter 12. The total reflection mirror 13 and the low refection film 8b constitute an external resonator.

In front of the low refection film 8b, a lens 9a is disposed such that a laser beam transmitting therethrough propagates in an optical fiber 10, and is sent out through an output port 11.

Now, referring to FIG. 4, another example of a conventional variable wavelength laser light source has the same construction as that shown in FIG. 3 except that the light-variable band-pass filter 12 and the total reflection mirror 13 shown in FIG. 3 are dispensed with, and instead, a grating 14 is provided. Parts common to FIGS. 3 and 4 are denoted by the same reference numerals to avoid duplication in explanation of the construction.

Next, referring to FIG. 3, operation of the conventional variable wavelength laser light source is described hereinafter. The outgoing light from the laser diode 8a is converted to the collimated light beam by the lens 9b, and reflected from the total reflection mirror 13 after going through the light-variable band-pass filter 12, transmitting light of specific wavelength. The collimated light beam propagates after changing its direction by 180° when reflected from the total reflection mirror 13, and falls on the laser diode 8a after passing through the light-variable band-pass filter 12 again. The light beam after entering the laser diode 8a is bounced back by the surface of the low refection film 8b having several % of reflectivity, and returns to the laser diode 8a again. The low refection film 8b and the total reflection mirror 13 constitute the external resonator, causing laser oscillation to occur.

The light beam with laser oscillation occurring travels via the lens 9a through the optical fiber 10, and outputted to the output port 11. This construction functions as the variable wavelength laser light source by varying wavelength transmitting the light-variable band-pass filter 12.

In the case of another conventional variable wavelength laser light source shown in FIG. 4, the construction thereof is similar to that shown in FIG. 3. The outgoing light from the laser diode 8a converted to the collimated light beam by the lens 9b falls on the grating 14, and after selection of wavelength by the grating utilizing diffraction of light waves, enters again into the laser diode 8a via the lens 9b. Thereafter, as shown in FIG. 3, the light beam with laser oscillation travels through the optical fiber 10 after transmitting through the lens 9a, and outputted to the output port 11.

With the conventional variable wavelength laser light sources as shown in FIGS. 3 and 4, a high ratio of light returning to an active layer of the laser diode is required to cause laser oscillation to occur. In addition, a light emitting region of the active layer of the laser diode is minuscule and on the order of 1 $\mu$m. Accordingly, optical components thereof need to be disposed with high precision in relation to each other.

SUMMARY OF THE INVENTION

In order to meet these requirements, advanced techniques of adjusting the optical axes of optical components for precise positioning thereof, and advanced techniques of securing the optical components to improve reliability have been required in fabrication of the conventional variable wavelength laser light sources with the result that composition of the components has become complex, posing a major stumbling block in production.

A variable wavelength laser light source according to the invention, developed to solve the problems described above with the conventional variable wavelength laser light source, comprises a laser diode 1 provided with a non-reflection film 7a on the front end face, and a high-reflection film 7b on the rear end face, and capable of causing laser oscillation by constituting an external resonator with the high-reflection film 7b and an optical return section, a wavelength selector 4 for selecting and outputting a light beam of a specific wavelength $\lambda$a from light falling thereon, a recombination and branching filter 3 for receiving outgoing light from the laser diode 1 and sending out same to the wavelength selector 4 while forming an optical return section by branching the light beam outputted from the wavelength selector 4 into a first output light beam and a second output light beam to enable the second output light beam to return to the laser diode 1, and an output port 11 for receiving and outputting the first output light beam branched off by the recombination and branching filter 3.

PREFERRED EMBODIMENTS OF THE INVENTION

Figure 1:
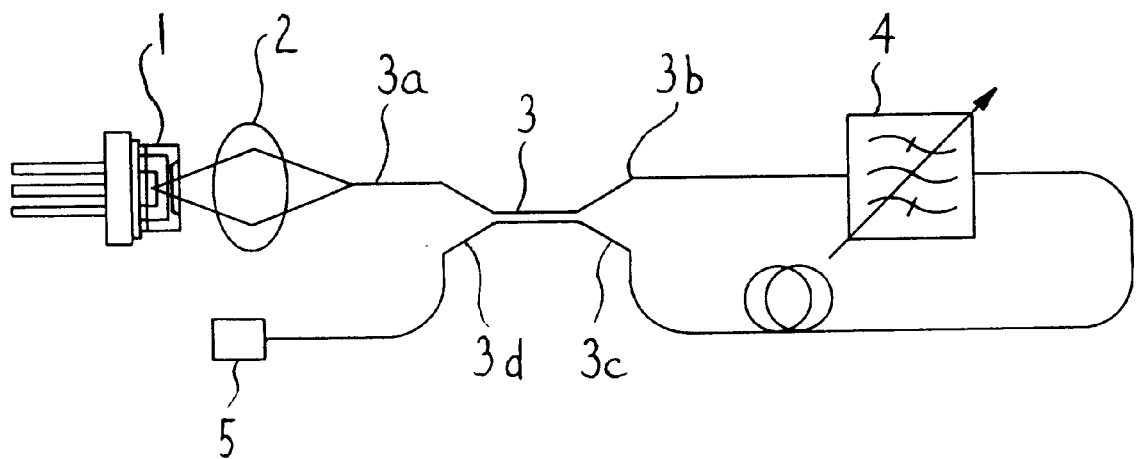
FIG. 1 is a schematic illustration showing the construction of an embodiment of a variable wavelength laser light source according to the invention.
Figure 2:
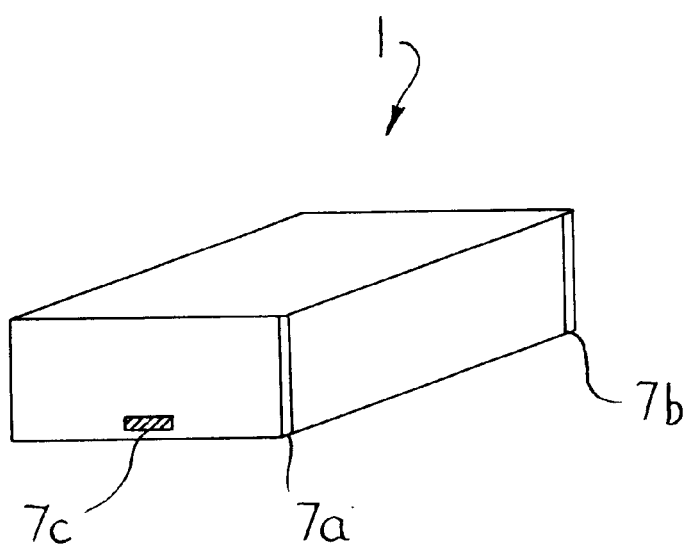
FIG. 2 is a perspective view of a laser diode, a device used in the embodiment of the variable wavelength laser light source as shown in FIG. 1.
Figure 3:
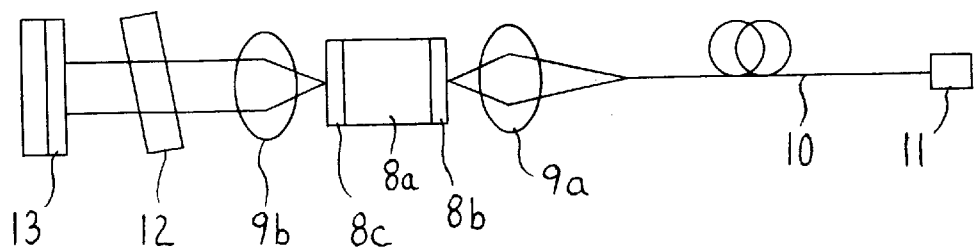
FIG. 3 is a schematic illustration showing the construction of an example of a conventional variable wavelength laser light source.
Figure 4:
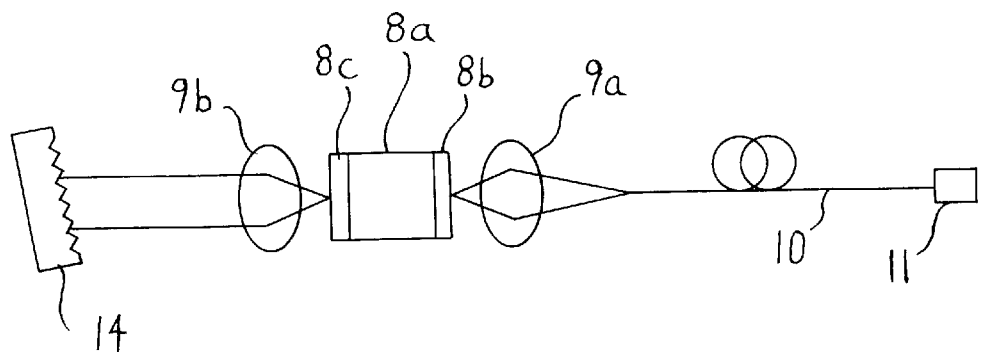
FIG. 4 a schematic illustration showing the construction of another example of a conventional variable wavelength laser light source.

Now, an embodiment of a variable wavelength laser light source according to the invention is described hereinafter with reference to the accompanying drawings. FIG. 1 is a schematic illustration showing the construction of the embodiment. A laser diode 1 shown in FIG. 1 is provided with a non-reflective film 7a of reflectivity not more than 0.1% on the front end face thereof as in FIG. 2 showing a perspective view thereof.

Further, the laser diode 1 is provided with a high reflection film 7b of reflectivity not less than 90% on the rear end face thereof. Reference numeral 7c denoted an active layer of the laser diode 1.

Light emitted from the laser diode 1 is condensed by a lens 2, and falls on a recombination and branching filter 3a. Recombination and branching filters 3a~3d are generally referred to as a recombination and branching filter 3. A fiber fusion type coupler or filter type coupler of, for example, 20:80, 15:85, or the like, may be used for the recombination and branching filter 3.

A light beam branched out by the recombination and branching filter 3 falls on a wavelength selector 4 via the recombination and branching filter 3b. In the wavelength selector 4, a light-variable band-pass filter having, for example, several $\mu$m in half value width is used, however, besides the light-variable band-pass filter, a grating, fiber grating, or the like may be used.

The wavelength selector 4 transmits a portion of the light beam falling thereon, having a specific wavelength $\lambda$a, which is then caused to fall on the recombination and branching filter 3c. In the recombination and branching filter 3, a light beam incoming from the recombination and branching filter 3c is branched into the recombination and branching filters 3a and 3d. The light beam branched into the recombination and branching filter 3a is returned via the lens 2 to the laser diode 1. A light path of the lens 2—the recombination and branching filter 3a—the recombination and branching filter 3b—the wavelength selector 4—the recombination and branching filter 3c—the recombination and branching filter 3a—the lens 2 constitutes an optical return path. The optical return path section and the high reflection film 7b make up an external resonator.

An output port 5 is coupled with the recombination and branching filter 3d, and a light beam branched into the recombination and branching filter 3d is sent out through the output port 5.

Now, the operation of the variable wavelength laser light source as shown in FIG. 1 is described hereinafter. The light emitted from the laser diode 1 falling on the recombination and branching filter 3 is spontaneously emitted light because laser oscillation has not occurred as yet since the laser diode 1 does not have resonance faces. The light falling on the recombination and branching filter 3a is branched into the recombination and branching filter 3b in the recombination and branching filter 3, and then, falls on the wavelength selector 4 transmitting a light beam of a specific wavelength $\lambda$a, which subsequently falls on the recombination and branching filter 3c.

The light beam falling on the recombination and branching filter 3c is again branched into the recombination and branching filters 3a and 3d of the recombination and branching filter 3, and a light beam branched into the recombination and branching filters 3a arrives at the lens 2 via the recombination and branching filters 3, is condensed by the lens 2, and returns to the laser diode 1, completing optical return.

As the light reflection film 7b of the laser diode 1 and the optical return path constitute the external resonator, laser oscillation is caused to occur by the agency of the laser diode 1 and the external resonator.

The light beam with laser oscillation is sent out to the output port 11 via the recombination and branching filter 3d. The wavelength of the laser oscillation is freely variable by selecting a wavelength at option in the wavelength selector 4.

The variable wavelength laser light source according to the invention is able to produce output as high as that for ordinary laser diodes by adjusting a ratio of an amount of light returning to the laser diode at 3 to 5%.

By adoption of the construction described above, a highly stable variable wavelength laser light source having excellent productivity is fabricated in combination with a Peltier device, thermistor, and the like for adjustment of temperature of the laser diode.

With the variable wavelength laser light source according to the invention wherein the laser diode is provided with the non-reflection film on the front end face, and the high reflection film on the rear end face, the outgoing light from the laser diode is branched out by the recombination and branching filter, and sent out to the wavelength selector 4 selecting a light beam of a specific wavelength, which is returned to the laser diode via the optical return path section so that a laser beam is caused to occur by the external resonator composed of the optical return path section and the high reflection film, and delivered from the output port via the recombination and branching filter. Hence, without use of particularly advanced technology, highly stable laser light of variable wavelength can be produced by means of a simple construction having excellent productivity.

What is claimed is:

1. A variable wavelength laser light source comprising:
   a laser diode provided with a non-reflection film on the front end face, and a high-reflection film on the rear end face, and capable of causing laser oscillation by constituting an external resonator with the high-reflection film and an optical return section;
   a wavelength selector for selecting and outputting a light beam of a specific wavelength from light falling thereon;
   a recombination and branching filter for receiving outgoing light from said laser diode and sending out same to said wavelength selector while forming said optical return section by branching the light beam outputted from the wavelength selector into a first output light beam and a second output light beam to enable said second output light beam to return to said laser diode; and
   an output port for receiving and outputting said first output light beam branched off by said recombination and branching filter.

2. A variable wavelength laser light source according to claim 1, wherein the outgoing light from the laser diode falls on the recombination and branching filter after condensed by a lens, and the second output light beam from the recombination and branching filter is caused to return to the laser diode after condensed by said lens.

* * * * *